(12) United States Patent
Noda et al.

(10) Patent No.: US 11,532,796 B2
(45) Date of Patent: Dec. 20, 2022

(54) DISPLAY DEVICE INCLUDING FLEXIBLE SUBSTRATE, POLARIZING PLATE, AND WARPAGE SUPPRESSING MEMBER

(71) Applicant: JOLED INC., Tokyo (JP)

(72) Inventors: Makoto Noda, Tokyo (JP); Hiroki Kato, Tokyo (JP)

(73) Assignee: JOLED INC., Tokyo (JP)

( * ) Notice: Subject to any disclaimer, the term of this patent is extended or adjusted under 35 U.S.C. 154(b) by 175 days.

(21) Appl. No.: 17/014,574

(22) Filed: Sep. 8, 2020

(65) Prior Publication Data

US 2021/0135134 A1 May 6, 2021

(30) Foreign Application Priority Data

Oct. 31, 2019 (JP) .............................. JP2019-198752

(51) Int. Cl.
*H01L 51/00* (2006.01)
*H01L 51/52* (2006.01)
*G09F 9/30* (2006.01)

(52) U.S. Cl.
CPC .......... *H01L 51/0097* (2013.01); *G09F 9/301* (2013.01); *H01L 51/5281* (2013.01)

(58) Field of Classification Search
None
See application file for complete search history.

(56) References Cited

U.S. PATENT DOCUMENTS

| | | | | |
|---|---|---|---|---|
| 10,944,079 | B2* | 3/2021 | Sun | H01L 51/0097 |
| 2006/0114387 | A1 | 6/2006 | Song et al. | |
| 2006/0132030 | A1* | 6/2006 | Gao | H01L 51/5237 313/511 |
| 2016/0187723 | A1 | 6/2016 | Yue et al. | |
| 2018/0337354 | A1* | 11/2018 | Sonoda | H01L 27/322 |
| 2019/0189971 | A1* | 6/2019 | Sun | H01L 27/3244 |
| 2021/0257567 | A1* | 8/2021 | Kishimoto | H01L 51/529 |
| 2021/0410306 | A1* | 12/2021 | Xia | H01L 51/0097 |

FOREIGN PATENT DOCUMENTS

| | | |
|---|---|---|
| CN | 102262314 A | 11/2011 |
| CN | 104570186 A | 4/2015 |
| JP | 2006-154731 A | 6/2006 |

* cited by examiner

*Primary Examiner* — J. E. Schoenholtz
(74) *Attorney, Agent, or Firm* — Greenblum & Bernstein, P.L.C.

(57) ABSTRACT

A display device includes a flexible substrate, a display device layer, a polarizing plate, and a warpage suppressing member. The flexible substrate has a front surface on a front surface side and a back surface on a back surface side. The display device layer is provided on the front surface side of the flexible substrate and includes a self-luminescent element. The polarizing plate is opposed to the flexible substrate across the display device layer and has a predetermined dimensional change characteristic corresponding to environmental change. The warpage suppressing member is provided on the back surface side of the flexible substrate and has a dimensional change characteristic of the same tendency as the dimensional change characteristic of the polarizing plate. The warpage suppressing member is configured to cancel at least a portion of warping stress of the polarizing plate to be applied to the flexible substrate.

14 Claims, 5 Drawing Sheets

DISPLAY DEVICE INCLUDING FLEXIBLE SUBSTRATE, POLARIZING PLATE, AND WARPAGE SUPPRESSING MEMBER

CROSS REFERENCE TO RELATED APPLICATIONS

This application claims the benefit of Japanese Priority Patent Application No. 2019-198752 filed on Oct. 31, 2019, the entire contents of which are incorporated herein by reference.

BACKGROUND

The technology relates to a display device including a flexible substrate.

A display device includes, for example, a display device layer and a polarizing plate, such as a circular polarizing plate, on a substrate. The polarizing plate includes a polarizer. Reference is made to Japanese Unexamined Patent Application Publication No. 2006-154731, for example.

In recent years, display devices have been applied to flexible displays. Such display devices include a flexible substrate, for example.

SUMMARY

A display device according to one embodiment of the disclosure includes a flexible substrate, a display device layer, a polarizing plate, and a warpage suppressing member. The flexible substrate has a front surface on a front surface side and a back surface on a back surface side. The display device layer is provided on the front surface side of the flexible substrate and includes a self-luminescent element. The polarizing plate is opposed to the flexible substrate across the display device layer and has a predetermined dimensional change characteristic corresponding to environmental change. The warpage suppressing member is provided on the back surface side of the flexible substrate and has a dimensional change characteristic of the same tendency as the dimensional change characteristic of the polarizing plate. The warpage suppressing member is configured to cancel at least a portion of warping stress of the polarizing plate to be applied to the flexible substrate.

BRIEF DESCRIPTION OF THE DRAWINGS

The accompanying drawings are included to provide a further understanding of the disclosure and are incorporated in and constitute a part of this specification. The drawings illustrate example embodiments and, together with the specification, serve to explain the principles of the disclosure.

DETAILED DESCRIPTION

It is desirable to suppress unintended deformation of a display device including a flexible substrate. The unintended deformation refers to, for example, warpage in a manufacturing process or a transportation process.

It is desirable to provide a display device that is able to suppress unintended deformation.

Some example embodiments of the technology will now be described with reference to the accompanying drawings. Note that the description is given in the following order.

1. Embodiment (an example display device including a warpage suppressing member)
2. Modification Example (an example in which a warpage suppressing member includes a resin material)
3. Application Example 1 (an example display device)
4. Application Example 2 (an example electronic apparatus)

Embodiment

[Example Configuration]

Figure 1:
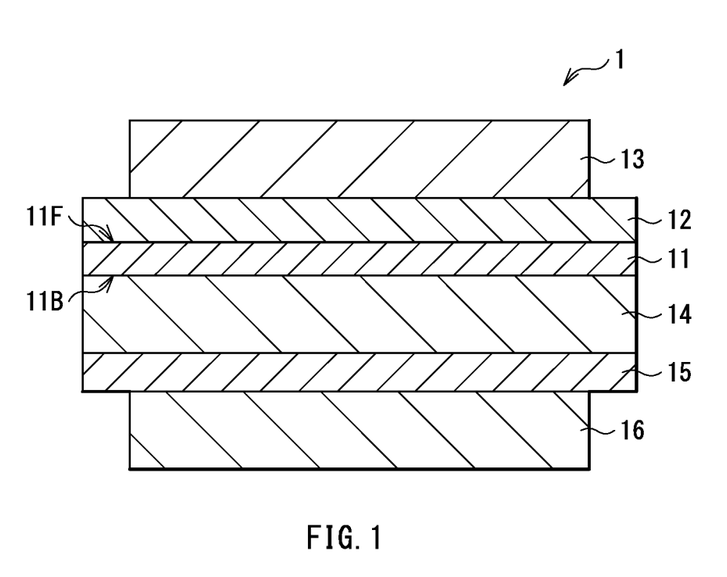
FIG. 1 is a schematic cross-sectional view of an example outline configuration of a display device according to one example embodiment of the technology.

FIG. 1 is a schematic cross-sectional view of an example outline configuration of a display device (display device 1) according to one example embodiment of the technology. The display device 1 may be, for example, a flexible display including an organic electroluminescent (EL) element on a substrate 11 having flexibility. The substrate 11 has a front surface (front surface 11F) and a back surface (back surface 11B) opposed to each other. The display device 1 includes, on the front surface 11F of the substrate 11, a display device layer 12 and a polarizing plate 13, for example, in this order. The display device 1 may include, on the back surface 11B of the substrate 11, a reinforcing member 14, a heat equalizing member 15, and a warpage suppressing member 16. The reinforcing member 14, the heat equalizing member 15, and the warpage suppressing member 16 may be provided in the order of the reinforcing member 14, the heat equalizing member 15, and the warpage suppressing member 16 from the substrate 11.

The substrate 11 with flexibility may include, for example, a resin material such as polyimide (PI). In other words, the substrate 11 may be a resin substrate (plastic substrate), for example. Alternatively, the substrate 11 may include glass or metal, for example. The substrate 11 may have a thickness of, for example, 5 µm to 100 µm. In one embodiment, the substrate 11 corresponds to a specific but non-limiting example of a "flexible substrate".

An under coat (UC) film may be provided between the substrate 11 and the display device layer 12. The UC film may prevent sodium ions or other substances from mitigating from the substrate 11 to upper layers. The UC film may include an insulating material, such as silicon nitride (SiN) or silicon oxide (SiO).

Thin-film transistors (TFT), for example, may be provided between the substrate 11 and the display device layer 12. The thin-film transistors are not illustrated. The thin-film transistor may be a top-gate, bottom-gate, or dual-gate thin-film transistor, for example, and may include a semiconductor layer in a selective region on the substrate 11. The semiconductor layer may include a channel region (active layer). The semiconductor layer may include an oxide semiconductor mainly including an oxide of one or more elements of indium (In), gallium (Ga), zinc (Zn), tin (Sn), titanium (Ti), and niobium (Nb), for example. Specific but non-limiting examples of the oxide semiconductor may include indium tin zinc oxide (ITZO), indium gallium zinc oxide (IGZO: InGaZnO), zinc oxide (ZnO), indium zinc oxide (IZO), indium gallium oxide (IGO), indium tin oxide (ITO), and indium oxide (InO). Alternatively, the semiconductor layer may include low-temperature polycrystalline silicon (LTPS) or amorphous silicon (a-Si), for example.

The display device layer 12 provided on the front surface 11F of the substrate 11 may include multiple pixels and organic electroluminescent elements. The organic electroluminescent elements may be driven by a backplane including the thin-film transistors to display an image. In one embodiment, the organic electroluminescent element corresponds to a specific but non-limiting example of a "self-luminescent element". The organic electroluminescent element may include, for example, an anode electrode, an organic layer including a light-emitting layer, and a cathode electrode in order from the substrate 11. The anode electrode may be coupled to a source-drain electrode of the thin-film transistor, for example. The cathode electrode may be supplied, through a wiring line, for example, with a cathode potential common to each of the pixels. The organic electroluminescent element may include, between the anode electrode and the light-emitting layer, a hole injection layer and a hole transport layer in this order from the anode electrode. The organic electroluminescent element may include, between the cathode electrode and the light-emitting layer, an electron injection layer and an electron transport layer in this order from the cathode electrode.

Figure 2:
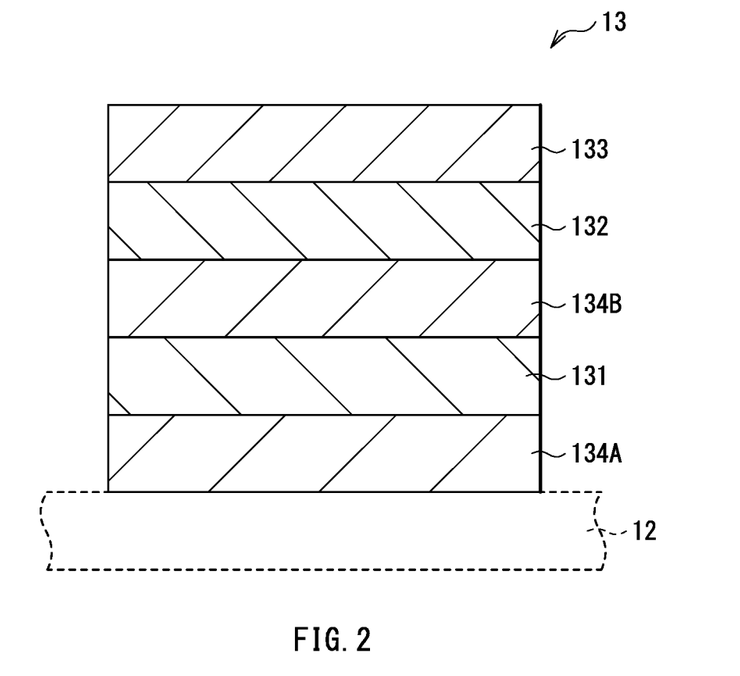
FIG. 2 is a schematic cross-sectional view of an example configuration of a polarizing plate illustrated in FIG. 1.

The polarizing plate 13 provided on the front surface 11F side of the substrate 11 is opposed to the substrate 11 across the display device layer 12. The polarizing plate 13 may be a circular polarizing plate, for example, and may serve to suppress reflection of external light incident on the display device 1. The polarizing plate 13 may include an organic material. The polarizing plate 13 has a predetermined dimensional change characteristic corresponding to environmental change. For example, the polarizing plate 13 may swell or shrink with temperature change. FIG. 2 illustrates a specific but non-limiting example configuration of the polarizing plate 13. The polarizing plate 13 may include, for example, a retardation layer 131, a polarizer 132, and a protective film 133 in this order from the display device layer 12. An adhesive layer 134A may be provided between the retardation layer 131 and the display device layer 12. An adhesive layer 134B may be provided between the retardation layer 131 and the polarizer 132.

The retardation layer 131 may, for example, introduce a quarter-wavelength phase difference between two polarized components. The retardation layer 131 may include polycarbonate (PC).

The polarizer 132 may provide linearly polarized light. The polarizer 132 may include, for example, a polyvinyl alcohol (PVA)-based film. For example, the polarizer 132 may include a polyvinyl alcohol-based resin film having a dichroic dye (iodine or an organic dye) adsorbed and aligned thereon. In one example, the polarizer 132 may have a thickness of about 2 μm to about 40 μm. In one example, the polarizer 132 may have a thickness of about 3 μm to about 30 μm. If the polarizer 132 is an uniaxially drawn PVA film having a dichroic dye adsorbed thereon, a physical property of the polarizer 132 in a drawing direction (MD direction) can differ from that in a direction (TD direction) perpendicular to the drawing direction. The physical property may be dimensional change caused by temperature change, for example. For example, the MD direction of the polarizer 132 may be disposed parallel to a panel longitudinal direction.

The protective film 133 may protect the polarizer 132 and the retardation layer 131. The protective film 133 may include, for example, triacetylcellulose (TAC).

The adhesive layer 134A may attach the retardation layer 131 to the display device layer 12. The adhesive layer 134B may attach the polarizer 132 to the retardation layer 131.

The reinforcing member 14 provided between the substrate 11 (the back surface 11B) and the heat equalizing member 15 may protect and reinforce the substrate 11 with flexibility. The reinforcing member 14 may include, for example, a resin material such as polyethylene terephthalate (PET). In that case, the reinforcing member 14 may have a thickness of 50 μm to 125 μm. Alternatively, the reinforcing member 14 may include a metallic thin film of a material such as stainless steel (e.g., Steel Use Stainless). The reinforcing member 14 may be plate-shaped, for example. In a case of including a metallic thin film, the reinforcing member 14 may have a thickness of, for example, 5 μm to 100 μm.

The heat equalizing member 15 provided between the reinforcing member 14 and the warpage suppressing member 16 may dissipate heat generated at the display device layer 12, for example. The heat equalizing member 15 may include a highly heat-dissipative material. The heat equalizing member 15 may be sheet-shaped, for example. The heat equalizing member 15 may include, for example, a material such as stainless steel, aluminum (Al), copper (Cu), or graphite. It is to be noted that the heat equalizing member 15 may be omitted in a case where a metallic thin film with a high heat dissipating property (thermal conductivity) is used as the reinforcing member 14.

In the example embodiment, the warpage suppressing member 16 may be provided on the back surface 11B of the substrate 11 with the reinforcing member 14 and the heat equalizing member 15 interposed therebetween. The warpage suppressing member 16 has a dimensional change characteristic of the same tendency as the dimensional change characteristic of the polarizing plate 13. For example, if the polarizing plate 13 swells with expected temperature change, the warpage suppressing member 16 may swell. If the polarizing plate 13 shrinks with expected temperature change, the warpage suppressing member 16 may shrink. In other words, the same tendency of dimensional change characteristics refers to the same sign (swell or shrinkage) of dimensional change corresponding to expected temperature change. This makes it possible to cancel at least a portion of warping stress of the polarizing plate 13 to be applied to the substrate 11. Thus, even if the polarizing plate 13 provided on the front surface 11F side of the substrate 11 warps, it is possible to suppress warpage of the substrate 11 due to the warpage of the polarizing plate 13. This will be described in detail later.

The warpage suppressing member 16 may be, for example, opposed to the substrate 11 across the reinforcing member 14 and the heat equalizing member 15. It is not strictly necessary for the display device 1 to include the heat equalizing member 15; for example, the warpage suppressing member 16 may be provided in contact with the reinforcing member 14. The warpage suppressing member 16 may have the same configuration as the polarizing plate 13, for example. Using the warpage suppressing member 16 having the same configuration as the polarizing plate 13 makes it possible to suppress warpage of the substrate 11 easily and effectively.

Figure 3:
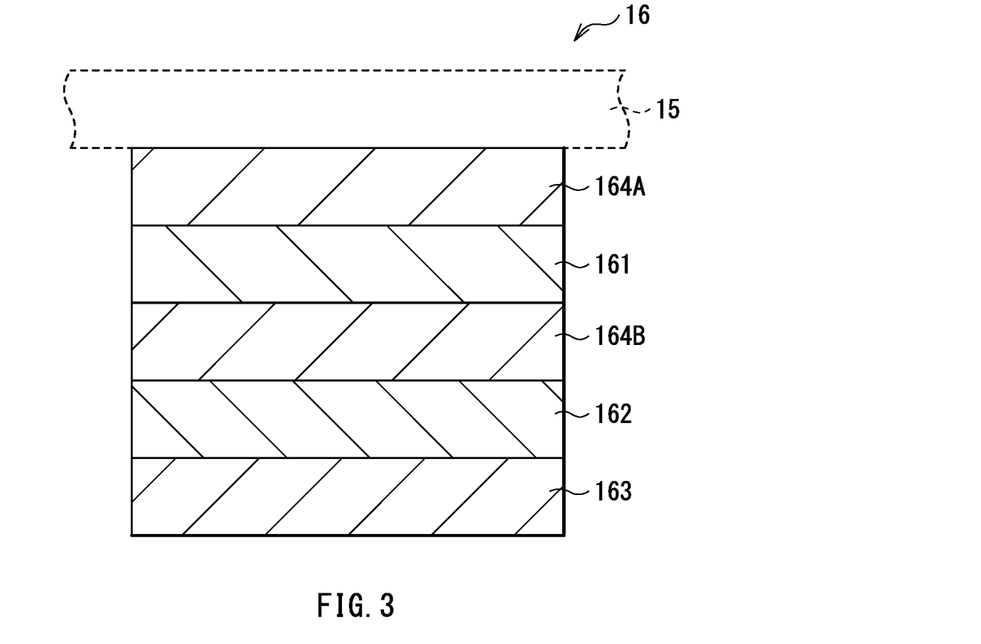
FIG. 3 is a schematic cross-sectional view of an example configuration of a warpage suppressing member illustrated in FIG. 1.

FIG. 3 illustrates a specific but non-limiting example configuration of the warpage suppressing member 16. The warpage suppressing member 16 may be plate-shaped, for example, as with the polarizing plate 13, and may have substantially the same thickness as the polarizing plate 13. The warpage suppressing member 16 may have, for example, the same planar shape as the polarizing plate 13. The warpage suppressing member 16 may include, for example, a retardation layer 161, a polarizer 162, and a protective film 163 in this order from the heat equalizing member 15. An adhesive layer 164A may be provided between the retardation layer 161 and the heat equalizing member 15. An adhesive layer 164B may be provided between the retardation layer 161 and the polarizer 162. The retardation layer 161 may include, for example, the same material as the retardation layer 131, and may have substantially the same thickness as the retardation layer 131. The polarizer 162 may include, for example, the same material as the polarizer 132, and may have substantially the same thickness as the polarizer 132. The protective film 163 may include, for example, the same material as the protective film 133, and may have substantially the same thickness as the protective film 133. The adhesive layers 164A and 164B may respectively include the same materials as the adhesive layers 134A and 134B, and may have substantially the same thicknesses as the adhesive layers 134A and 134B. If the polarizer 132 is an uniaxially drawn PVA film having a dichroic dye adsorbed thereon, the polarizer 162 of the warpage suppressing member 16 may also include, for example, an uniaxially drawn PVA film having a dichroic dye adsorbed thereon. In this case, for example, the warpage suppressing member 16 may be disposed to make the MD direction of the polarizer 162 parallel to the MD direction of the polarizer 132. For example, the MD direction of the polarizer 162 and the MD direction of the polarizer 132 may both be disposed parallel to the panel longitudinal direction. The MD direction of the polarizer 162 of the warpage suppressing member 16 may thus be disposed in alignment with the MD direction of the polarizer 132 of the polarizing plate 13. This makes it possible to effectively suppress warpage of the substrate 11 even if each of the polarizers 132 and 162 has a physical property, such as dimensional change, that differs between in the MD direction and in the TD direction.

Figure 4:
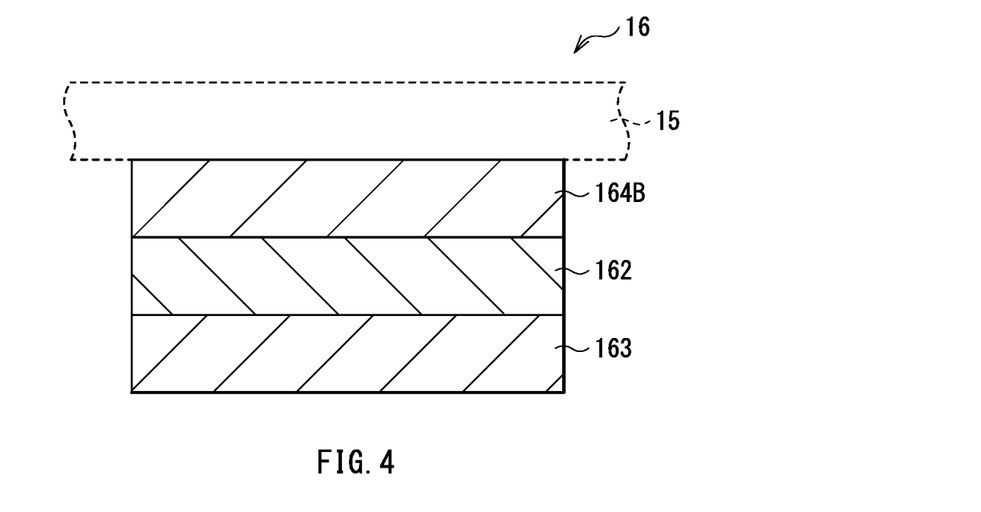
FIG. 4 is a schematic cross-sectional view of another example configuration of the warpage suppressing member illustrated in FIG. 3.

FIG. 4 illustrates another example configuration of the warpage suppressing member 16. It is not strictly necessary for the warpage suppressing member 16 to include the retardation layer (the retardation layer 161 in FIG. 3). For example, the warpage suppressing member 16 may include the polarizer 162 and the protective film 163 in this order from the heat equalizing member 15, and the adhesive layer 164B may be provided between the polarizer 162 and the heat equalizing member 15. In one example, the warpage suppressing member 16 may include the polarizer 162. For example, the MD direction of the polarizer 162 may be disposed parallel to the MD direction of the polarizer 132. The MD direction of the polarizer 162 and the MD direction of the polarizer 132 may both be disposed parallel to the panel longitudinal direction. Warpage of the polarizing plate 13 may be greatly affected by dimensional change of the polarizer 132 caused by temperature change, for example. Therefore, causing the warpage suppressing member 16 to include the polarizer 162 having the same configuration as the polarizer 132 makes it possible to effectively suppress warpage of the flexible substrate due to warpage of the polarizing plate 13.

[Example Workings and Effects]
[Basic Operation]

The display device 1 may cause the pixels of the display device layer 12 to display an image based on external image signals. In this case, the thin-film transistor may be voltage-driven for each of the pixels, for example. In one example, when a voltage equal to or greater than a threshold voltage is applied to the thin-film transistor, the semiconductor layer described above may be activated (a channel may be formed), generating a current flowing between the paired source-drain electrodes of the thin-film transistor. Such voltage driving performed on the thin-film transistor may be used to display an image on the display device 1.

In the display device 1 according to the example embodiment, the warpage suppressing member 16 is provided on the back surface 11B side of the substrate 11. This makes it possible to cancel at least a portion of warping stress of the polarizing plate 13 to be applied to the substrate 11. Therefore, even if the polarizing plate 13 on the front surface 11F side of the substrate 11 warps, it is possible to suppress, with the warpage suppressing member 16, warpage of the substrate 11 due to the warpage of the polarizing plate 13. These workings and effects will now be described with reference to a comparative example.

Figure 5:
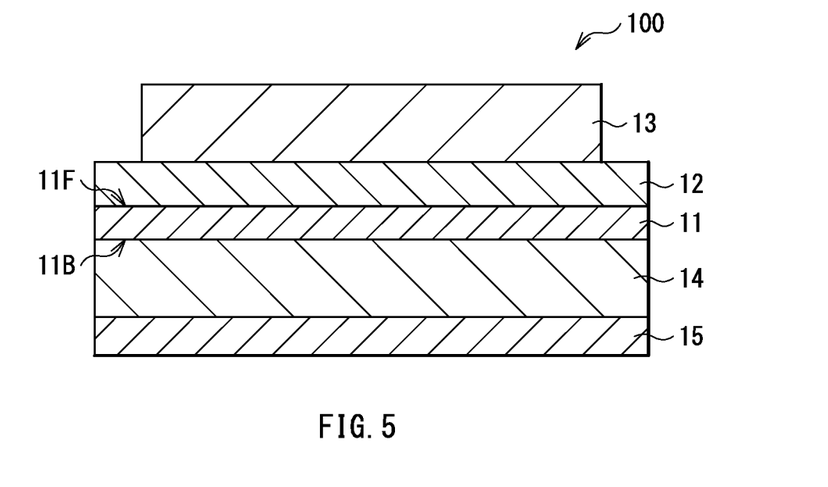
FIG. 5 is a schematic cross-sectional view of a display device according to a comparative example.

FIG. 5 schematically illustrates a cross-sectional configuration of a display device (display device 100) according to the comparative example. The display device 100 may include the display device layer 12 and the polarizing plate 13 on the front surface 11F side of the substrate 11 with flexibility. The display device 100 may also include the reinforcing member 14 and the heat equalizing member 15 on the back surface 11B side of the substrate 11. In the display device 100, the warpage suppressing member (the warpage suppressing member 16 in FIG. 1) may not be provided on the back surface 11B side of the substrate 11. The display device 100 may differ from the display device 1 in this point.

Figure 6:
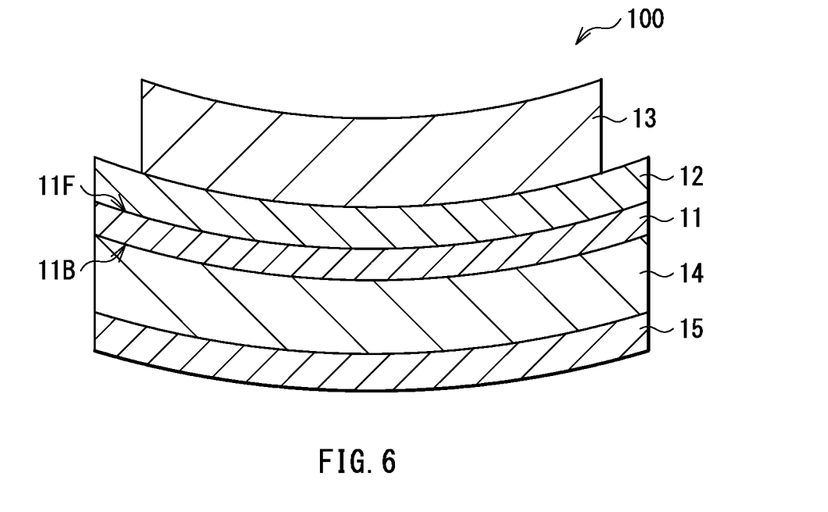
FIG. 6 is a schematic cross-sectional view of an example state after a thermal process of the display device illustrated in FIG. 5.

FIG. 6 illustrates an example shape of the display device 100 after a thermal process. The display device 100 may undergo a thermal process such as aging, for example, which can unintentionally cause the polarizing plate 13 to warp. The substrate 11 can warp with the warpage of the polarizing plate 13, which can result in deformation of the whole display. Warpage of the polarizing plate 13 may be mainly caused by dimensional change due to temperature change in a polyvinyl alcohol-based film, for example, included in the polarizer (the polarizer 132 in FIG. 2). Also in a transportation process of shipping the display device 100, for example, the substrate 11 can warp with warpage of the polarizing plate 13. Such warpage of the substrate 11 may be suppressed by transporting the display device 100 with temperature managed strictly, but this can increase cost for transportation. As another method of suppressing warpage of the substrate 11 due to warpage of the polarizing plate 13, cover glass may be attached to the front surface 11F of the substrate 11 via the polarizing plate 13. In this case, however, the display device 100 reaches a customer with the cover glass attached. It can thus be difficult to meet customer needs sufficiently.

In contrast, in the display device 1, the warpage suppressing member 16 is provided on the back surface 11B side of the substrate 11. Therefore, even if dimensional change occurs in the polarizing plate 13, force to be applied to the front surface 11F side of the substrate 11 with the dimensional change of the polarizing plate 13 may partially or wholly be canceled out by force to be applied to the back surface 11B side of the substrate 11 with dimensional change of the warpage suppressing member 16. This makes it possible to suppress warpage of the substrate 11 due to warpage of the polarizing plate 13, resulting in suppression of deformation of the whole display. This configuration makes it possible to manufacture and ship the display device 1 without attaching cover glass, which helps to meet customer needs more flexibly. This configuration also widens an allowable range of temperature during transportation, which makes it possible to suppress cost for transportation.

In the example embodiment as described above, the warpage suppressing member is provided on the back surface side of the flexible substrate, which makes it possible to suppress warpage of the flexible substrate due to warpage of the polarizing plate. This helps to suppress unintended deformation.

Described below is a modification example of the example embodiment. In the following description, the same components as those in the foregoing example embodiment will be denoted by the same reference numerals, and description thereof will be omitted as appropriate.

[Modification Example]

Figure 7:
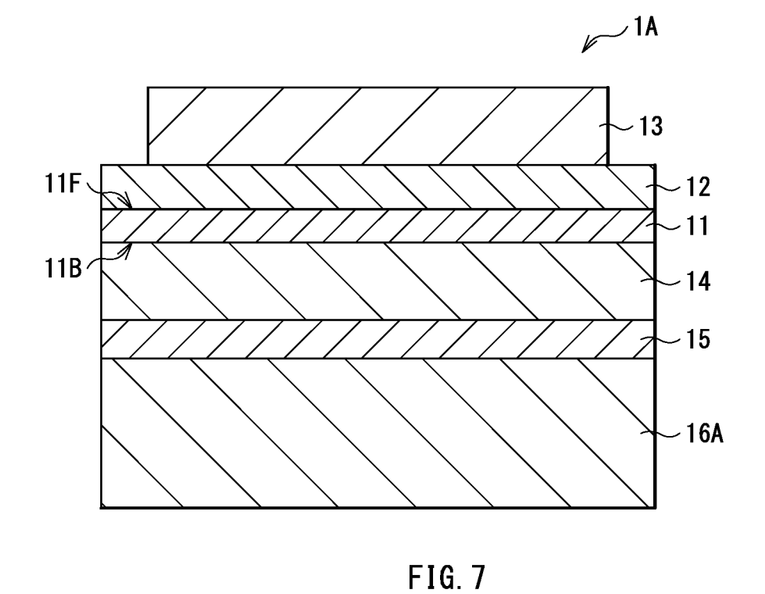
FIG. 7 is a schematic cross-sectional view of an example outline configuration of a display device according to a modification example.

FIG. 7 schematically illustrates a cross-sectional configuration of a part of a display device (display device 1A) according to the modification example of the foregoing example embodiment. The display device 1A may include a warpage suppressing member (warpage suppressing member 16A) having a configuration different from the configuration of the polarizing plate 13. Except for this point, the display device 1A may have a configuration similar to that of the display device 1 according to the foregoing example embodiment, and may achieve similar workings and effects.

The warpage suppressing member 16A may include, for example, polyethylene terephthalate (PET), polystyrene (PS), polypropylene (PP), cycloolefin polymer (COP), cyclic olefin copolymer (COC), polyethersulfone (PES), or polycarbonate (PC). The warpage suppressing member 16A may have a single-layer structure including any one of these materials or a layered structure including two or more of these materials.

In one example, the warpage suppressing member 16A may exhibit a dimensional change rate close to a dimensional change rate of the polarizing plate 13. For example, the dimensional change rate (DB) of the warpage suppressing member 16A and the dimensional change rate (DF) of the polarizing plate 13 may satisfy the following expression (1). This makes it possible to effectively suppress warpage of the substrate 11 due to warpage of the polarizing plate 13.

$$|DF-DB|/(DF+DB) \le 0.3 \quad (1),$$

where

DF denotes the dimensional change rate of the polarizing plate 13, and

DB denotes the dimensional change rate of the warpage suppressing member 16A.

If the dimensional change rate of the polarizing plate 13 differs, for example, between in the MD direction and in the TD direction, the warpage suppressing member 16A may be configured to, for example, cancel at least a portion of warpage in the direction exhibiting the larger dimensional change rate. For example, if the dimensional change rate varies in an in-plane direction of the polarizer 132, the warpage suppressing member 16A may also include, for example, a film whose dimensional change rate varies in an in-plane direction. In this case, the warpage suppressing member 16A and the polarizer 132 may be disposed to make directions exhibiting the larger dimensional change rate parallel to each other. For example, if the dimensional change rate of the polarizer 132 in the MD direction is larger than the dimensional change rate in the TD direction, the warpage suppressing member 16A may also include a film whose dimensional change rate differs between in the MD direction and in the TD direction. In this example, the MD direction of the warpage suppressing member 16A and the MD direction of the polarizer 132 may be disposed to be parallel to each other. This enables the warpage suppressing member 16A to effectively cancel warping stress of the polarizer 132 in the MD direction, which applies larger warping stress to the substrate 11.

In one example, the warpage suppressing member 16A may include a PET film. PET films, which are relatively inexpensive among resin films, make it possible to suppress raw material cost. In addition, PET films have a wide variety of film thicknesses, which makes it easy to select an optimum film thickness. This makes it possible to suppress warpage of the substrate 11 effectively. Furthermore, PET films have a relatively high shrinkage ratio among resin films. Therefore, even a PET film with a small thickness is able to suppress warpage of the substrate 11 effectively. If the warpage suppressing member 16A includes such a PET film, it is possible to make the dimensional change rate of the warpage suppressing member 16A close to the dimensional change rate of the polarizing plate 13. This makes it possible to suppress warpage of the substrate 11 effectively. Under conditions of 150 degrees centigrade and two hours, the PET film to be used as the warpage suppressing member 16A may exhibit a dimensional change rate of 1.0% or more in the MD direction and 0.1% or more in the TD direction. In other words, in this case, the dimensional change rate in the MD direction may be larger than the dimensional change rate in the TD direction.

The dimensional change rate (D) may be calculated, for example, by the following expression (2). For example, the dimensional change rate (DF) of the polarizing plate 13 may be calculated from a length (L0) of the polarizing plate 13 in an absorption axis direction before temperature change, and a length (L1) of the polarizing plate 13 in the absorption axis direction after the temperature change.

$$D=\{(L0-L1)/L0\}\times 100 \quad (2),$$

where

D denotes a dimensional change rate,

L0 denotes a length (mm) in a predetermined axis direction before temperature change, and L1 denotes a length (mm) in the predetermined axis direction after the temperature change.

The warpage suppressing member 16A may be film-shaped, for example, and may cover the whole back surface 11B of the substrate 11 via the reinforcing member 14 and the heat equalizing member 15. In one example, the warpage suppressing member 16A may have a thickness of equal to or less than 30 times the thickness of the polarizer 132. In one example, the warpage suppressing member 16A may have a thickness of greater than 10 times the thickness of the polarizer 132 and equal to or less than 30 times the thickness of the polarizer 132. In consideration of a position of a neutral point of the display device 1A and thermal shrinkage, for example, of the reinforcing member 14 and the substrate 11, it can be difficult for the warpage suppressing member 16A having substantially the same thickness as the polarizing plate 13 to sufficiently suppress warpage of the substrate 11.

For example, if the thickness of the polarizer 132 is 18 µm, the warpage suppressing member 16A including a PET film may have a thickness of 180 µm to 540 µm.

Figure 8:
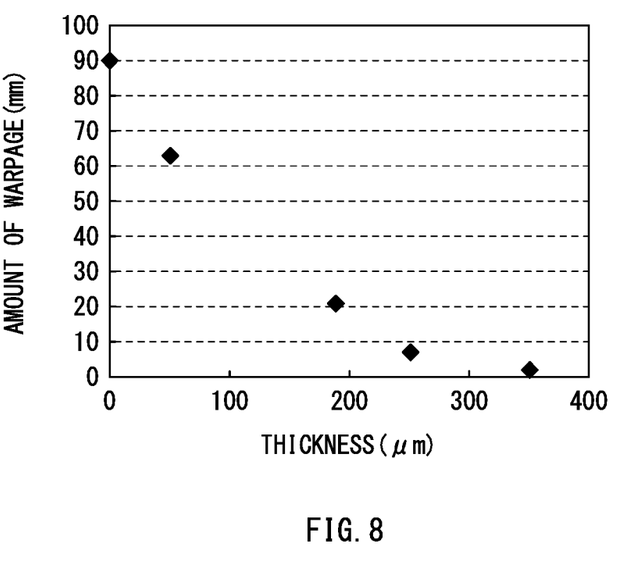
FIG. 8 is a diagram illustrating an example relationship between a thickness of a warpage suppressing member illustrated in FIG. 7 and an amount of warpage of the display device.

FIG. 8 illustrates a relationship between a thickness (µm) of the warpage suppressing member 16A including a PET film, and an amount of warpage (mm) of the display device 1A. The thickness of the polarizer 132 in this case may be 18 µm. As illustrated in FIG. 8, it is possible to make the amount of warpage of the display device 1A gradually smaller with an increase in the thickness of the warpage suppressing member 16A.

The warpage suppressing member 16A of the display device 1A may include a PET film, for example, and may have a configuration different from the configuration of the polarizing plate 13. The display device 1A is also able to suppress unintended deformation, as with the display device 1. It is to be noted that, even in a case where the reinforcing member 14 also includes a PET film, for example, having a dimensional change rate equivalent to that of the warpage suppressing member 16A, a warpage suppression effect of the reinforcing member 14 is ignorable. One reason for this is small contribution of the reinforcing member 14 to stress to be exerted on the substrate 11, which is attributable to a stacked position of the reinforcing member 14 in the display device 1A as follows. The reinforcing member 14 may be closer to the neutral point of the display device 1A than the polarizing plate 13 and the warpage suppressing member 16A are.

APPLICATION EXAMPLE

Description will be given on an example of application (application example) of the display devices 1 and 1A according to the foregoing example embodiments to an electronic apparatus. Hereinafter, the display devices 1 and 1A will be simply referred to as the display device 1.

First, an example block configuration of the display device 1 will be described.

[Example Block Configuration of Display Device 1]

Figure 9:
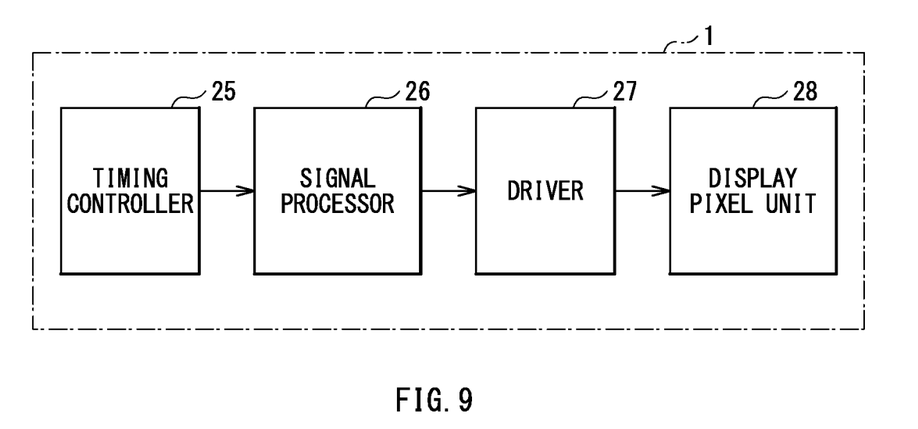
FIG. 9 is a block diagram illustrating an example outline configuration of the display device illustrated in FIG. 1, for example.

FIG. 9 is a block diagram schematically illustrating an example outline configuration of the display device 1. The display device 1 may display images based on signals generated inside the display device 1 or received from an external device. The display device 1 may be applied to a liquid crystal display, for example, as well as the organic electroluminescent display described above. The display device 1 may include a timing controller 25, a signal processor 26, a driver 27, and a display pixel unit 28, for example.

The timing controller 25 may include a timing generator that generates various timing signals (control signals). The timing controller 25 may drive the signal processor 26 and other components on the basis of the various timing signals.

The signal processor 26 may perform a predetermined correction of digital image signals received from an external device, for example, and may output the corrected image signals to the driver 27.

The driver 27 may include a scanning line driving circuit and a signal line driving circuit, for example. The driver 27 may drive the pixels in the display pixel unit 28 via various control lines.

The display pixel unit 28 may include display elements such as organic electroluminescent elements or liquid crystal display elements (e.g., the display device layer 12 described above) and pixel circuits that drive the respective display elements.

[Example Configuration of Electronic Apparatus]

The display device 1 described with reference to the example embodiments described above may be applied to various electronic apparatuses.

Figure 10:
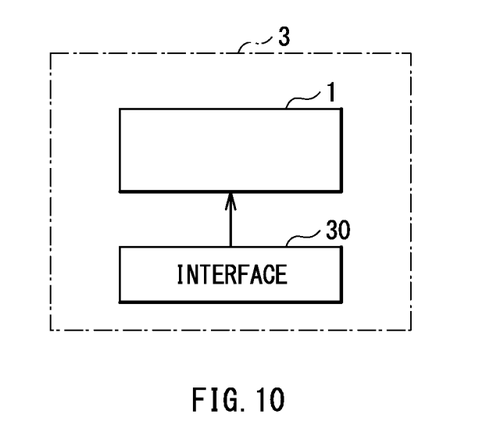
FIG. 10 is a block diagram illustrating an example outline configuration of an electronic apparatus including the display device illustrated in FIG. 9.

FIG. 10 is a block diagram illustrating an example of application of the display device 1 illustrated in FIG. 9 to an electronic apparatus (electronic apparatus 3). Examples of the electronic apparatus 3 may include a television unit, a personal computer (PC), a smartphone, a tablet PC, a mobile phone, a digital still camera, and a digital video camera.

The electronic apparatus 3 may include the display device 1 and an interface 30, for example. The interface 30 may be an input unit that receives various signals and electric power from external devices. Optionally, the interface 30 may include a user interface, such as a touch panel, a keyboard, or operation buttons.

Although the technology has been described with reference to the example embodiments, modification examples, and application examples, the technology is not limited thereto, but may be modified in a variety of ways.

For example, the material and the thickness of each layer described in the example embodiments described above are non-limiting examples, and each layer described in the example embodiments described above may include another material or may have another thickness. It is not strictly necessary for the display device to include all of the layers described above, or the display device may further include another layer in addition to the layers described above.

Although the foregoing example embodiments etc. have described a case where the display device layer 12 includes organic electroluminescent elements, the display device layer 12 may include, for example, other self-luminescent elements such as inorganic electroluminescent elements.

It should be appreciated that the effects described herein are mere examples. Effects of the example embodiments, modification examples, and application examples of the technology are not limited to those described herein. The technology may further include any effects other than those described herein.

Furthermore, the technology encompasses any possible combination of some or all of the various embodiments and the modifications described herein and incorporated herein.

It is possible to achieve at least the following configurations from the foregoing example embodiments of the technology.

(1) A display device including:
a flexible substrate having a front surface on a front surface side and a back surface on a back surface side;
a display device layer provided on the front surface side of the flexible substrate and including a self-luminescent element;
a polarizing plate opposed to the flexible substrate across the display device layer and having a predetermined dimensional change characteristic corresponding to environmental change; and
a warpage suppressing member provided on the back surface side of the flexible substrate and having a dimensional change characteristic of a same tendency as the dimensional change characteristic of the polarizing plate, the warpage suppressing member being configured to cancel at least a portion of warping stress of the polarizing plate to be applied to the flexible substrate.
(2) The display device according to (1), in which the warpage suppressing member has a configuration that is same as a configuration of the polarizing plate.
(3) The display device according to (1), in which
the polarizing plate includes a polarizer, and
the warpage suppressing member includes a material that is same as a material included in the polarizer.
(4) The display device according to any one of (1) to (3), in which the warpage suppressing member includes at least one of polyethylene terephthalate, polystyrene, polypropylene, cycloolefin polymer, cyclic olefin copolymer, polyethersulfone, or polycarbonate.
(5) The display device according to any one of (1) to (4), in which the dimensional change characteristic corresponding to temperature change of the warpage suppressing member exhibits the same tendency as the dimensional change characteristic corresponding to temperature change of the polarizing plate.
(6) The display device according to any one of (1) to (5), in which the warpage suppressing member has a thickness of greater than 10 times a thickness of the polarizer and equal to or less than 30 times the thickness of the polarizer.
(7) The display device according to any one of (1) to (6), in which the polarizing plate includes an organic material.
(8) The display device according to any one of (1) to (7), in which the self-luminescent element includes an organic electroluminescent element.

In the display device according to at least one example embodiment of the technology, the warpage suppressing member is provided on the back surface side of the flexible substrate. Thus, even if the polarizing plate on the front surface side of the flexible substrate warps, it is possible to suppress, with the warpage suppressing member, warpage of the flexible substrate due to the warpage of the polarizing plate.

In the display device according to at least one example embodiment of the technology, the warpage suppressing member is provided on the back surface side of the flexible substrate, which makes it possible to suppress warpage of the flexible substrate due to warpage of the polarizing plate. This helps to suppress unintended deformation.

It is to be noted that effects of the example embodiments, modification examples, and application examples of the technology should not be limited to those described hereinabove, and may be any effect described herein.

Although the technology is described hereinabove in terms of example embodiments, modification examples, and application examples, it is not limited thereto. It should be appreciated that variations may be made in the described example embodiments by persons skilled in the art without departing from the scope of the technology as defined by the following claims. The limitations in the claims are to be interpreted broadly based on the language employed in the claims and not limited to examples described in this specification or during the prosecution of the application, and the examples are to be construed as non-exclusive. For example, in this technology, the use of the terms first, second, etc. do not denote any order or importance, but rather the terms first, second, etc. are used to distinguish one element from another. The term "disposed on/provided on/formed on" and its variants as used herein refer to elements disposed directly in contact with each other or indirectly by having intervening structures therebetween. Moreover, no element or component in this technology is intended to be dedicated to the public regardless of whether the element or component is explicitly recited in the following claims.

What is claimed is:
1. A display device, comprising:
a flexible substrate having a front surface on a front surface side and a back surface on a back surface side;
a display device layer provided on the front surface side of the flexible substrate and including a self-luminescent element;
a polarizing plate opposed to the flexible substrate across the display device layer and having a predetermined dimensional change characteristic; and
a warpage suppressing member provided on the back surface side of the flexible substrate and having a dimensional change characteristic of swelling or shrinkage in a same direction of swelling or shrinkage of the dimensional change characteristic of the polarizing plate corresponding to temperature change, the warpage suppressing member being configured to cancel at least a portion of warping stress of the polarizing plate to be applied to the flexible substrate,
wherein the warpage suppressing member has a configuration different from a configuration of the polarizing plate, and
the warpage suppressing member includes at least one of polyethylene terephthalate, polystyrene, polypropylene, cycloolefin polymer, cyclic olefin copolymer, polyethersulfone, or polycarbonate.
2. The display device according to claim 1,
wherein the polarizing plate includes a polarizer, and
the warpage suppressing member includes a material that is same as a material included in the polarizer.
3. The display device according to claim 1,
wherein the dimensional change characteristic corresponds to temperature change, and
wherein the dimensional change characteristic corresponding to temperature change of the warpage suppressing member exhibits the same tendency as the dimensional change characteristic corresponding to temperature change of the polarizing plate.
4. The display device according to claim 1,
wherein the warpage suppressing member has a thickness of greater than 10 times a thickness of the polarizer and equal to or less than 30 times the thickness of the polarizer.
5. The display device according to claim 1,
wherein the polarizing plate includes an organic material.
6. The display device according to claim 1,
wherein the self-luminescent element comprises an organic electroluminescent element.
7. The display device according to claim 1,
wherein the warpage suppressing member comprises a polyethylene terephthalate (PET) monolayer sheet.
8. The display device according to claim 1,
wherein the warpage suppressing member includes a polyethylene terephthalate (PET) film having a thickness of 180 μm to 540 μm.
9. The display device according to claim 8,
wherein the PET film on the warpage suppressing member exhibits dimension change rates, such that a dimensional change rate in the MD direction is larger than a dimensional change rate in the TD direction.

10. The display device according to claim 2, wherein the MD direction of the warpage suppressing member and the MD direction of the polarizer are disposed to be parallel to each other.

11. The display device according to claim 1, wherein a reinforcing member is provided between the substrate and the warpage suppressing member.

12. The display device according to claim 11, wherein the reinforcing member comprises polyethylene terephthalate (PET) or stainless steel.

13. The display device according to claim 11, wherein a heat equalizing member is provided between the reinforcing member and the warpage suppressing member.

14. A display device, comprising:
a flexible substrate having a front surface on a front surface side and a back surface on a back surface side;
a display device layer provided on the front surface side of the flexible substrate and including a self-luminescent element;
a polarizing plate opposed to the flexible substrate across the display device layer and having a predetermined dimensional change characteristic; and
a warpage suppressing member provided on the back surface side of the flexible substrate and having a dimensional change characteristic of swelling or shrinkage in a same direction of swelling or shrinkage of the dimensional change characteristic of the polarizing plate corresponding to temperature change, the warpage suppressing member being configured to cancel at least a portion of warping stress of the polarizing plate to be applied to the flexible substrate,
wherein the warpage suppressing member does not include a retardation layer or a polarizer; and
the warpage suppressing member includes at least one of polyethylene terephthalate, polystyrene, polypropylene, cycloolefin polymer, cyclic olefin copolymer, polyethersulfone, or polycarbonate.

* * * * *